US008237596B2

(12) United States Patent
Zhao et al.

(10) Patent No.: US 8,237,596 B2
(45) Date of Patent: Aug. 7, 2012

(54) APPARATUS AND METHOD FOR SIMPLIFYING DIGITAL-TO-ANALOG CONVERTER CIRCUITRY USING GRAY CODE

(75) Inventors: Jianhua Zhao, Shanghai (CN); Yuan Yuan, Beijing (CN); Yuxing Zhang, Wuxi (CN)

(73) Assignee: STMicroelectronics R&D (Shanghai) Co., Ltd., Shanghai (CN)

( * ) Notice: Subject to any disclaimer, the term of this patent is extended or adjusted under 35 U.S.C. 154(b) by 0 days.

(21) Appl. No.: 12/964,228

(22) Filed: Dec. 9, 2010

(65) Prior Publication Data

US 2011/0156935 A1  Jun. 30, 2011

(30) Foreign Application Priority Data

Dec. 31, 2009  (CN) .......................... 2009 1 1000202

(51) Int. Cl.
*H03M 1/66* (2006.01)
(52) U.S. Cl. ......................... 341/145; 345/690; 345/211
(58) Field of Classification Search .......... 341/140–154; 345/87, 98, 88, 211, 690
See application file for complete search history.

(56) References Cited

U.S. PATENT DOCUMENTS

| | | | | | |
|---|---|---|---|---|---|
| 5,731,774 | A | * | 3/1998 | Fujii et al. | 341/144 |
| 5,977,898 | A | * | 11/1999 | Ling et al. | 341/144 |
| 6,163,289 | A | * | 12/2000 | Ginetti | 341/145 |
| 6,642,877 | B2 | * | 11/2003 | Leung | 341/144 |
| 7,079,062 | B2 | | 7/2006 | Panov et al. | |
| 7,079,362 | B2 | * | 7/2006 | Hasegawa | 360/324.12 |
| 7,173,597 | B2 | * | 2/2007 | Kato | 345/99 |
| 7,283,082 | B1 | * | 10/2007 | Kuyel | 341/155 |
| 7,304,596 | B2 | * | 12/2007 | Lin et al. | 341/145 |
| 2003/0128071 | A1 | | 7/2003 | Nguyen et al. | |
| 2012/0032828 | A1 | * | 2/2012 | Zhao et al. | 341/138 |

* cited by examiner

*Primary Examiner* — Lam T Mai
(74) *Attorney, Agent, or Firm* — Gardere Wynne Sewell LLP (57) ABSTRACT

For high resolution resistor string DACs, a resistor string is placed in an array of columns and rows, each resistor tap is connected to a switch network, and a decoder is used to select switches to be closed such that sub-DAC voltage comes from the resistor taps connected to the selected switches. The voltages from each row of the resistor string are fed into a multiplexer, wherein the multiplexer produces an output voltage. A method and apparatus are disclosed for implementing the reflective nature of Gray code to design a DAC such that all the switches in a column of the resistor string may be controlled with only one control signal, thereby reducing extra routing costs, surface area, and dynamic power consumed by the circuit.

21 Claims, 3 Drawing Sheets

APPARATUS AND METHOD FOR SIMPLIFYING DIGITAL-TO-ANALOG CONVERTER CIRCUITRY USING GRAY CODE

CROSS-REFERENCE TO RELATED APPLICATIONS

Pursuant to 35 U.S.C. §119 (a)-(d), this application claims priority to Chinese Patent Application No. 200911000202.1, entitled "Apparatus and Method for Simplifying Digital-to-Analog Converter Circuitry Using Gray Code," filed Dec. 31, 2009.

BACKGROUND

Technical Field

The present disclosure relates generally to Digital-to-Analog circuitry and, more specifically, to a method and apparatus for simplifying a resistor string Digital-to-Analog Converter circuit to reduce costs, surface area, and dynamic power consumed by the circuit.

INTRODUCTION

Digital-to-Analog Converters (DACs) are commonly used in mixed-mode systems requiring monotonicity, wherein the DAC acts as an interface to convert a digital code to an analog signal for processing. For high resolution resistor string DACs, the resistor string is typically placed in several rows whereby the resistors of one row align with resistors of another row to form columns. In this design, each resistor is connected to a switch network through a resistor tap, and a binary-to-unary decoder is used to select switches to be closed such that the sub-DAC voltage comes from the resistor taps connected to the selected switches. The output voltage from each row is then fed into a multiplexer and the multiplexer provides an output voltage. Previous methods have been disclosed to reduce the surface area required for the resistor string DAC circuitry.

One method for arranging the series-connected resistors uses rows of resistors in a zigzag layout. In other words, connecting the resistors in rows such that the current in the odd rows flows in one direction, and the current in the even rows flows in the opposite direction. However, one drawback of this architecture is that multiple control signals are required to control the switches in the odd and even rows of the same column, which requires additional routing resources. Typically, one set of control signals is used to control the switches in the odd rows while another set of control signals is used to control the switches in the even rows. This arrangement requires extra control lines as well as additional decoding and driving circuits, which means more surface area is required and more dynamic power is used by the circuit.

In high performance system design, a differential signal is widely used to reduce noise, harmonics, and interferences within a DAC circuit. When a differential signal is used in resistor string DAC embodiments, a conventional solution implements two DACs loaded with complementary data. However, this design typically requires twice the surface area and power consumption of a single DAC layout. Additionally, the use of two DACs results in a mismatching whereby the DAC output contains additional offset error, non-linearity, and harmonics.

SUMMARY

The present disclosure provides a method for implementing the reflective nature of Gray code in a resistor string DAC circuit such that a single control signal can control tap switches connected to taps in a resistor string arranged in a column and row format. Accordingly, additional routing components are eliminated, while surface area and dynamic power consumed by the circuit are reduced.

Embodiments of the present disclosure provide a resistor string DAC architecture, or a differential resistor string DAC architecture that utilize the disclosed method. The output voltages of the DAC architectures share a single resistor string and tap switches. Accordingly, the components required to build the DAC architectures are reduced while the required surface area and power consumption, as well as offset error, non-linearity, and harmonics, are decreased.

The foregoing and other features and advantages of the present disclosure will become further apparent from the following detailed description of the embodiments, read in conjunction with the accompanying drawings. The detailed description and drawings are merely illustrative of the disclosure, rather than limiting the scope of the invention as defined by the appended claims and equivalents thereof.

BRIEF DESCRIPTION OF THE DRAWINGS

Embodiments are illustrated by way of example in the accompanying figures, in which like reference numbers indicate similar parts, and in which.

DETAILED DESCRIPTION OF THE DRAWINGS

One embodiment of the present disclosure provides a method for implementing the reflective nature of Gray code in a DAC circuit such that a single set of control signals can control the switches in both odd and even rows of a column, thereby eliminating additional routing components and reducing surface area and dynamic power used by the circuit.

Figure 1:
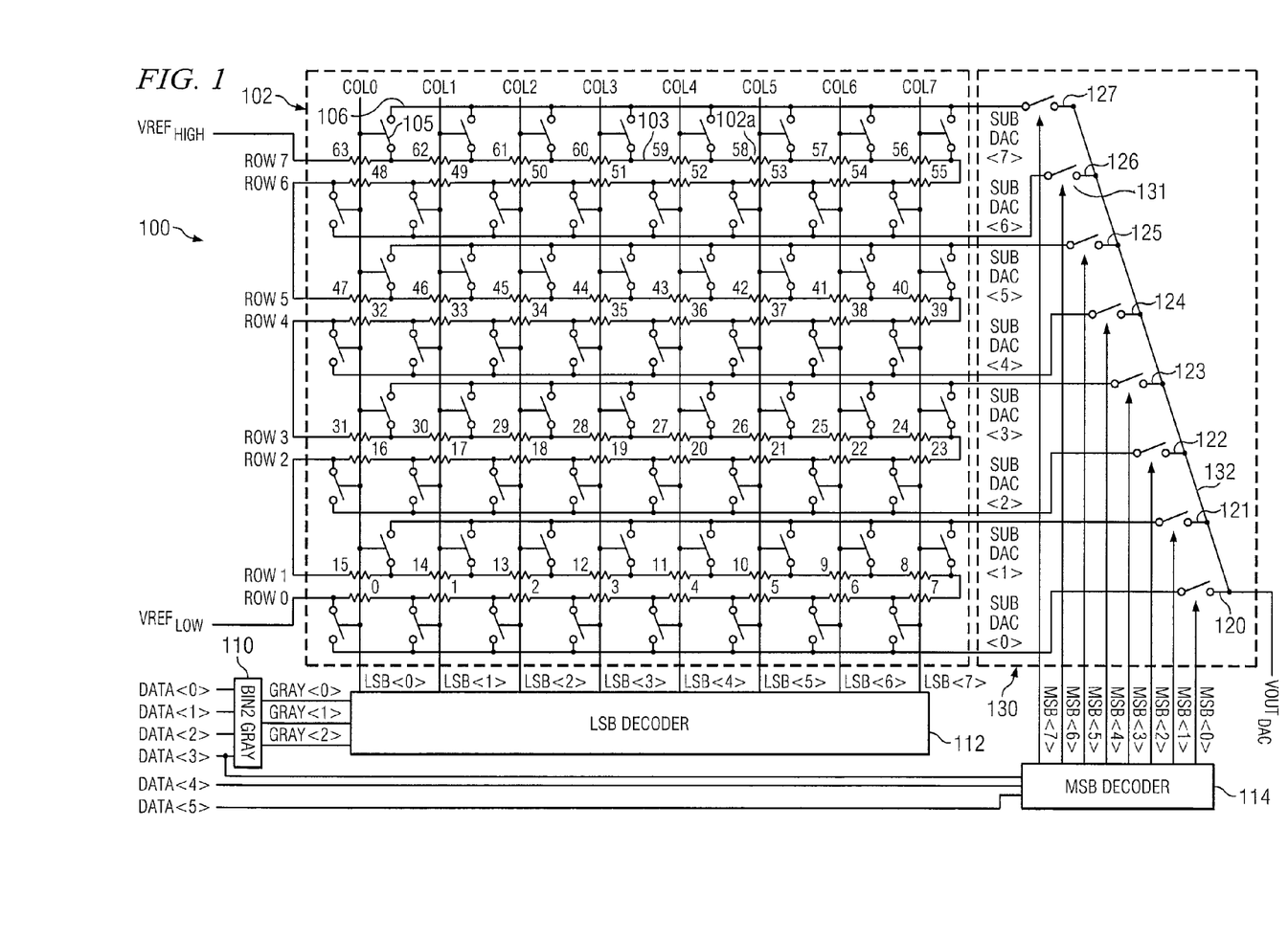
FIG. 1 is a circuit diagram for a 6-bit resistor string DAC.

Reference is made to FIG. 1, which illustrates an exemplary 6-bit resistor string DAC circuit 100. The circuit 100 includes a high reference voltage node VREFHIGH and a low reference voltage node VREFLOW. Connected to reference voltage nodes VREFHIGH and VREFLOW is a string of series-connected resistors 102. The string of resistors 102 is laid out in a zigzag pattern to form an array of eight rows and eight columns of resistors 102 such that the current in the odd rows flows in one direction, and the current in the even rows flows in the opposite direction. The eight rows of the array are numbered from ROW0 to ROW7, wherein each row contains eight individual resistors 102a. The eight columns of the array are numbered from COL0 to COL7, wherein each column contains eight individual resistors 102a. The resistance values of the resistors 102 are substantially the same, and a difference between the reference voltages at the nodes VREFHIGH and VREFLOW is divided evenly across each resistor 102a. Although the resistors 102 typically have substantially equal resistance values, it may be advantageous to implement resistors 102 having varying resistance values across the string of resistors 102.

Several components of the present disclosure may comprise multiple elements, and may be represented as a group of said elements in a particular order. For example, the array of resistors 102 is comprised of eight rows. Accordingly, the group of rows may be represented as "ROW<7:0>" wherein the numbers "7" and "0" indicate ROW7 through ROW0 (and all rows in between) in descending order. Additionally, if the rows are represented as "ROW<0:7>" the numbers indicate ROW0 through ROW7 (and all rows in between) in ascending order. This representation may be applied to any group of elements within the present disclosure.

In accordance with FIG. 1 of the present disclosure, when reference is made to a group of resistors, reference number "102" is used. When reference is made to an arbitrary individual resistor, reference number "102a" is used. Additionally, each individual resistor 102a located in the array is individually numbered (from 0-63 as shown) such that when reference is made to a specific resistor, the corresponding resistor number is used. For example, according to FIG. 1, "resistor number 0" or "resistor 0" refers to the first resistor 102a located in the first column (COL0), along the first row (ROW0) of resistors 102 between the low reference voltage node VREFLOW and the second resistor 102a, resistor number 1.

Each individual resistor 102a is connected to an adjacent individual resistor 102a at a resistor tap node 103, wherein resistor tap node 103 may be disclosed herein as "resistor tap node," "resistor tap," or "tap." Also located at each resistor tap node 103 is a switch 105, wherein the switch 105 may be a transistor well known in the art, such as, for example, a pass FET. Each switch 105 is connected to a resistor tap 103, and is operable to connect the tap 103 to a sub-DAC voltage line 106 such that the voltage across the resistor(s) 102a located between the low reference voltage node VREFLOW and said switch 105 is applied to the sub-DAC voltage line 106. This voltage is called the "sub-DAC voltage," and may be referred to herein as the "resistor string voltage." In an exemplary embodiment when the switch 105 located at resistor number 62 is closed, the resistor string voltage across resistors 0-61 is applied to the sub-DAC voltage line 106 of ROW7. The resistor string, or sub-DAC, voltage at each sub-DAC voltage line 106 is labeled according to the corresponding row of each respective sub-DAC voltage line 106. For example, the sub-DAC voltage located along the sub-DAC voltage line 106 of ROW7 is labeled as SUBDAC<7>.

The sub-DAC voltage lines 106 of ROW0 through ROW7 are connected to the inputs of an 8:1 multiplexer 130, such that the sub-DAC voltages SUBDAC<7:0> are provided as input voltages to multiplexer voltage lines 120-127 of the multiplexer 130. The multiplexer 130 includes eight multiplexer voltage lines 120-127, wherein each multiplexer voltage line corresponds to the sub-DAC voltage line 106 of a row of resistors 120. For example, multiplexer voltage line 120 corresponds to the sub-DAC voltage line 106 of ROW0 and receives sub-DAC voltage SUBDAC<0>. Additionally, multiplexer voltage lines 121, 122, 123, 124, 125, 126, and 127 correspond to the sub-DAC voltage lines 106 of ROW1, ROW2, ROW3, ROW4, ROW5, ROW6, and ROW7, respectively, and receive sub-DAC voltages SUBDAC<1>, SUBDAC<2>, SUBDAC<3>, SUBDAC<4>, SUBDAC<5>, SUBDAC<6>, and SUBDAC<7>, respectively.

The multiplexer 130 further includes eight switches 131 and a voltage output node 132. Each switch 131 is connected to one multiplexer voltage line, and is operable, when selected, to transmit the sub-DAC voltage received on its respective multiplexer voltage line to the output node 132 of the multiplexer 130, wherein the transmitted voltage is also the output voltage VOUTDAC of the circuit 100. For example, when the switch 131 located on multiplexer voltage line 124 is closed, the sub-DAC voltage, SUBDAC<4>, received at multiplexer voltage line 124, is transmitted to the output node 132 of the multiplexer 130. In accordance with this example, the output voltage VOUTDAC of the circuit 100 is the sub-DAC voltage SUBDAC<4>.

Six-bit binary data is provided to the circuit 100 as input data DATA<5:0>. The four least significant bits (LSBs) of the input data, DATA<3:0>, are input to a binary-to-Gray code converter 110, and are converted into three-bit Gray coded data GRAY<2:0>. The Gray coded data, GRAY<2:0>, is then sent to a LSB decoder 112, and decoded to produce a set of unary LSB control signal bits LSB<7:0> (otherwise referred to as a LSB control signal), wherein the set of LSB control signal bits LSB<7:0> is the output of the LSB decoder 112. The columns COL<7:0> of the array of resistors 102 are each connected to respective LSB control signal bits LSB<7:0> of the LSB decoder 112. For example, COL0 is connected to LSB control signal bit LSB<0>, and the switches 105 connected to the resistors 102 located in COL0 are activated by LSB control signal bit LSB<0>. Additionally, the switches 105 connected to the resistors 102 located in columns COL<1:7> are activated by respective LSB control signal bits LSB<1:7>.

Only one of the LSB control signal bits LSB<7:0> is active at a time (in response to the Gray coded data GRAY<2:0>), and thus the set of LSB control signal bits LSB<7:0> is operable to select one of the columns COL<7:0> of resistors 102 and activate the switches 105 connected to the respective resistor taps 103 of the resistors 102 located in the selected column. Accordingly, the set of LSB control signal bits LSB<7:0> determines which one of the eight switches 105 in each row of resistors 102 is closed such that the sub-DAC voltages come from the respective resistor taps 103 connected to the switches 105 in only one column selected by the set of LSB control signal bits LSB<7:0>.

Table 1 provides a truth table illustrating the input data bits DATA<3:0>, the corresponding 3-bit Gray code GRAY<2:0>, and the decoded unary LSB control signal bits LSB<7:0>. Because Gray code is reflective, the same Gray code value may represent more than one input data value, and accordingly, the corresponding set of unary LSB control signal bits LSB<7:0> may be used for more than one input value. For example, as illustrated in FIG. 1 and Table 1, resistor number 3 and resistor number 12 are in even row ROW0 and odd row ROW1, respectively, of the column corresponding to control signal bit LSB<3>, COL3. However, resistors 3 and 12 have different input data values, 0011 and 1100, respectively. Nevertheless, because of the reflective property of Gray code, they have the same Gray code value, 010, and consequently, the same LSB control signal. Accordingly, the switches 105 connected to all of the resistors 102 located in COL3 are activated by LSB control signal bit LSB<3> such that when the value of LSB<3> is a "1," the switches 105 are closed, and sub-DAC voltages SUBDAC<7:0> are received from the respective resistor taps 103 connected to the resistors 102 located in COL3 (resistors 3, 12, 19, 28, 35, 44, 51, and 60). Thus, switches 105 located along a column of resistors 102 respond to a single set of LSB control signal bits regardless of whether the switches 105 are in even or odd rows.

TABLE 1

| Dec Value | DATA<3:0> | GRAY<2:0> | LSB<7:0> | | | | | | | |
|---|---|---|---|---|---|---|---|---|---|---|
| 0 | 0000 | 000 | 0 | 0 | 0 | 0 | 0 | 0 | 0 | 1 |
| 1 | 0001 | 001 | 0 | 0 | 0 | 0 | 0 | 0 | 1 | 0 |
| 2 | 0010 | 011 | 0 | 0 | 0 | 0 | 0 | 1 | 0 | 0 |
| 3 | 0011 | 010 | 0 | 0 | 0 | 0 | 1 | 0 | 0 | 0 |
| 4 | 0100 | 110 | 0 | 0 | 0 | 1 | 0 | 0 | 0 | 0 |
| 5 | 0101 | 111 | 0 | 0 | 1 | 0 | 0 | 0 | 0 | 0 |
| 6 | 0110 | 101 | 0 | 1 | 0 | 0 | 0 | 0 | 0 | 0 |
| 7 | 0111 | 100 | 1 | 0 | 0 | 0 | 0 | 0 | 0 | 0 |
| 8 | 1000 | 100 | 1 | 0 | 0 | 0 | 0 | 0 | 0 | 0 |
| 9 | 1001 | 101 | 0 | 1 | 0 | 0 | 0 | 0 | 0 | 0 |
| 10 | 1010 | 111 | 0 | 0 | 1 | 0 | 0 | 0 | 0 | 0 |
| 11 | 1011 | 110 | 0 | 0 | 0 | 1 | 0 | 0 | 0 | 0 |
| 12 | 1100 | 010 | 0 | 0 | 0 | 0 | 1 | 0 | 0 | 0 |
| 13 | 1101 | 011 | 0 | 0 | 0 | 0 | 0 | 1 | 0 | 0 |
| 14 | 1110 | 001 | 0 | 0 | 0 | 0 | 0 | 0 | 1 | 0 |
| 15 | 1111 | 000 | 0 | 0 | 0 | 0 | 0 | 0 | 0 | 1 |
| . | . | . | . | . | . | . | . | . | . | . |
| . | . | . | . | . | . | . | . | . | . | . |
| . | . | . | . | . | . | . | . | . | . | . |
| 63 | 1111 | 000 | 0 | 0 | 0 | 0 | 0 | 0 | 0 | 1 |

The reflective nature of Gray code allows the circuit to control the switches 105 in a specific column with only one set of LSB control signal bits. Therefore, by implementing a decoding method using Gray code, the circuit is able to control the switches 105 for the resistors 102 in both odd and even rows of the same column with only one control signal, even if the binary input data is different for the resistors 102 located in the odd and even rows. Hence, it is unnecessary to provide circuitry for an additional control signal to control switches in odd or even rows. By reducing unnecessary circuitry, less space and power are consumed by the DAC circuit 100.

The three most significant bits (MSBs) of the input data, DATA<5:3>, are input to a MSB decoder 114, and decoded to produce a set of unary MSB control signal bits MSB<7:0> (otherwise referred to as a MSB control signal). The set of MSB control signal bits MSB<7:0> is the output of the MSB decoder 114, and each of the MSB control signal bits MSB<7:0> is connected to a switch 131 located in the multiplexer 130. Specifically, the control signal bits MSB<0>, MSB<1>, MSB<2>, MSB<3>, MSB<4>, MSB<5>, MSB<6>, and MSB<7> are connected to the switches 131 located at multiplexer voltage lines 120, 121, 122, 123, 124, 125, 126, and 127, respectively. The switches 131 are activated by MSB control signal bits MSB<7:0> such that when the value of the MSB control signal bit connected to a switch 131 is a "1," the switch 131 is closed, and the voltage located at the switch 131 is transmitted to the voltage output node 132 of the multiplexer 130. In essence, the set of MSB control signal bits MSB<7:0> determines which of the received sub-DAC voltages is selected as the output voltage, VOUTDAC, of the circuit 100. For example, if MSB control signal bit MSB<5> is a "1," the switch 131 connected to multiplexer voltage line 125 closes, and SUBDAC<5> is transmitted to the voltage output node 132 of the multiplexer 130 and is the output voltage, VOUTDAC, of the circuit 100.

Another embodiment of the present disclosure provides a differential resistor string DAC architecture, similar to the resistor string DAC disclosed in the previous embodiment, that utilizes the reflective nature of Gray code as described above. The differential output voltages of the differential DAC share a string of series-connected resistors 202 and their respective sub-DAC switches 205. Accordingly, the components required to build the differential resistor string DAC circuit are reduced while the required surface area and power consumption, as well as offset error, non-linearity, and harmonics, are decreased.

Figure 2:
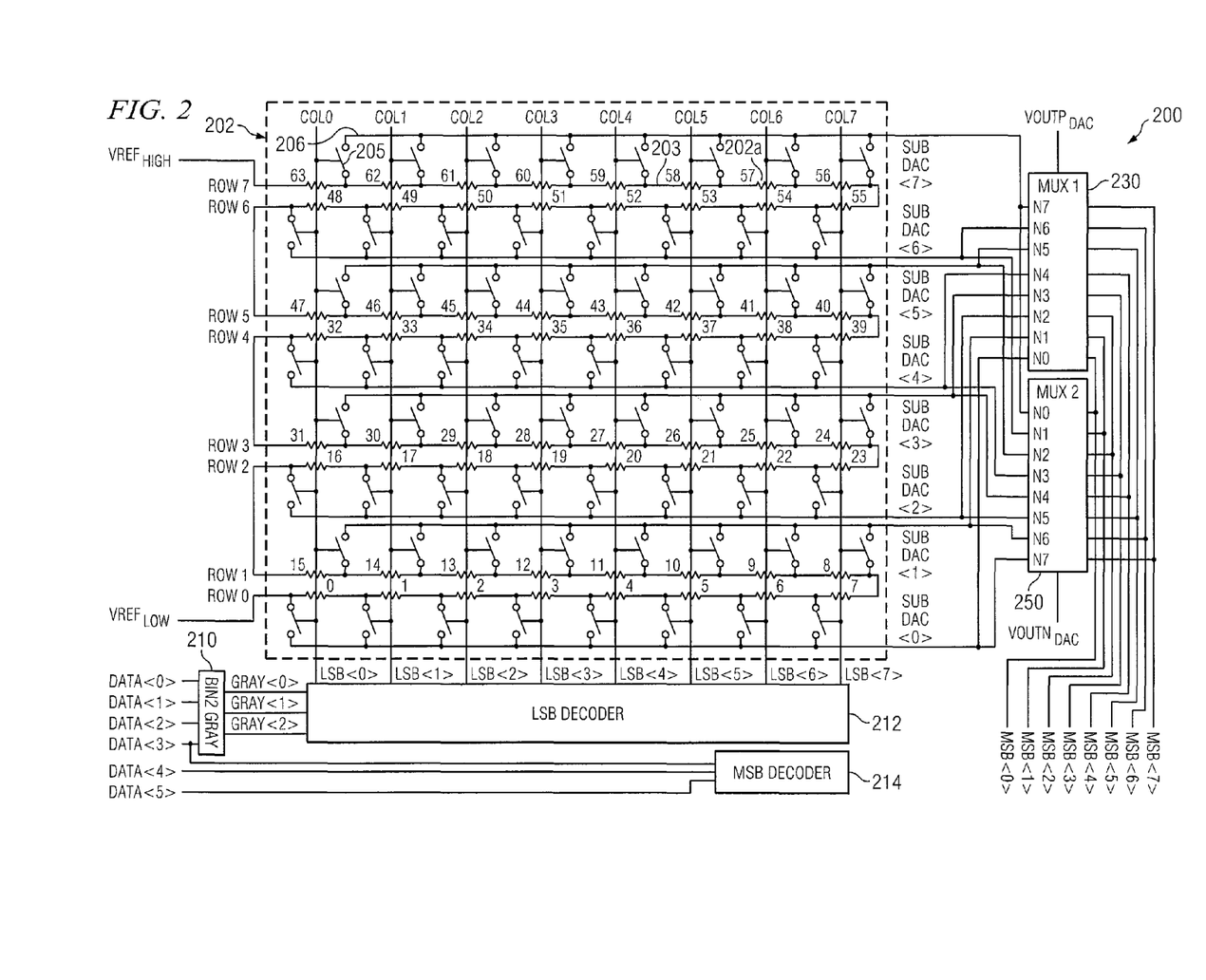
FIG. 2 is a circuit diagram for a 6-bit differential resistor string DAC.

Reference is now made to FIG. 2, which illustrates an exemplary 6-bit differential resistor string DAC circuit 200. Although the circuit 200 is similar in some regards to the circuit 100 described above in reference to FIG. 1, the circuit 200 described in the present embodiment is a differential DAC with two multiplexers, each multiplexer providing a differential output voltage that is reflected, with respect to the output voltage of the other multiplexer, about the common mode voltage of the DAC circuit 200. The circuit 200 receives a high reference voltage at the VREFHIGH node and a low reference voltage at the VREFLOW node. The common mode voltage, VCOM, of the differential circuit is equal to half the difference of the VREFHIGH and VREFLOW voltages as represented by the equation below:

$$V_{com} = \frac{VREFHIGH - VREFLOW}{2}$$

Connected to reference voltage nodes VREFHIGH and VREFLOW is a string of series-connected resistors 202. The string of resistors 202 is laid out in a zigzag pattern to form an array of eight rows and eight columns of resistors 202 such that the current in the odd rows flows in one direction, and the current in the even rows flows in the opposite direction. The eight rows of the array are numbered from ROW0 to ROW7, wherein each row contains eight individual resistors 202a. The eight columns of the array are numbered from COL0 to COL7, wherein each column contains eight individual resistors 202a. The resistance values of the resistors 202 are substantially the same, and a difference between the reference voltages at the nodes VREFHIGH and VREFLOW is divided evenly across each resistor 202a. Although the resistors 202 typically have substantially equal resistance values, it may be advantageous to implement resistors 202 having varying resistance values across the string of resistors 202.

In accordance with FIG. 2 of the present disclosure, when reference is made to a group of resistors, reference number "202" is used. When reference is made to an arbitrary individual resistor, reference number "202a" is used. Additionally, each individual resistor 202a located in the array is individually numbered (from 0-63 as shown) such that when reference is made to a specific resistor, the corresponding resistor number is used. For example, according to FIG. 2, "resistor number 0" or "resistor 0" refers to the first resistor 102a located in the first column (COL0), along the first row (ROW0) of resistors 102 between the low reference voltage node VREFLOW and the second resistor 102a, resistor number 1. A resistor tap 203 may be disclosed herein to describe a connection point between a switch 205 and a single resistor 202a.

As with FIG. 1, each individual resistor 202a in FIG. 2 is connected to an adjacent individual resistor 202a at a resistor tap node 203. Also located at each resistor tap node 203 is a switch 205, wherein the switch 205 is operable to connect the tap 203 to a sub-DAC voltage line 206 such that the resistor string, or sub-DAC, voltage across the resistor(s) 202a located between the low reference voltage node VREFLOW and said switch 205 is applied to the sub-DAC voltage line 206. For example, when the switch 205 located at resistor 60 is closed, the voltage across resistors 0-59 is applied to the sub-DAC voltage line 206 of ROW7. The sub-DAC voltage at each sub-DAC voltage line 206 is labeled according to the corresponding row of each respective sub-DAC voltage line

206. For example, the sub-DAC voltage located along the sub-DAC voltage line 206 of ROW7 is labeled as SUB-DAC<7>.

The string of resistors 202 and their respective sub-DAC switches 205, sub-DAC voltage lines 206, and sub-DAC voltages SUBDAC<7:0> are shared by a first 8:1 multiplexer 230 and a second 8:1 multiplexer 250. Accordingly, the sub-DAC voltage lines 206 of ROW0 through ROW7 are connected to the voltage input nodes, N0-N7, of the first multiplexer 230 and the second multiplexer 250 such that the sub-DAC voltages SUBDAC<7:0> are provided as the eight input voltages to each multiplexer 230 and 250. As illustrated in FIG. 2, the multiplexer input voltages SUBDAC<7:0> are connected to the input voltage nodes, N0-N7, of the first multiplexer 230 in a first sequential order, and are connected to the input voltage nodes, N0-N7, of the second multiplexer 250 in a second sequential order, wherein the second sequential order is the reverse of the first sequential order. For example, SUB-DAC<0> connects to input voltage node N0 of the first multiplexer 230, but connects to input voltage node N7 of the second multiplexer 250.

Figure 3:
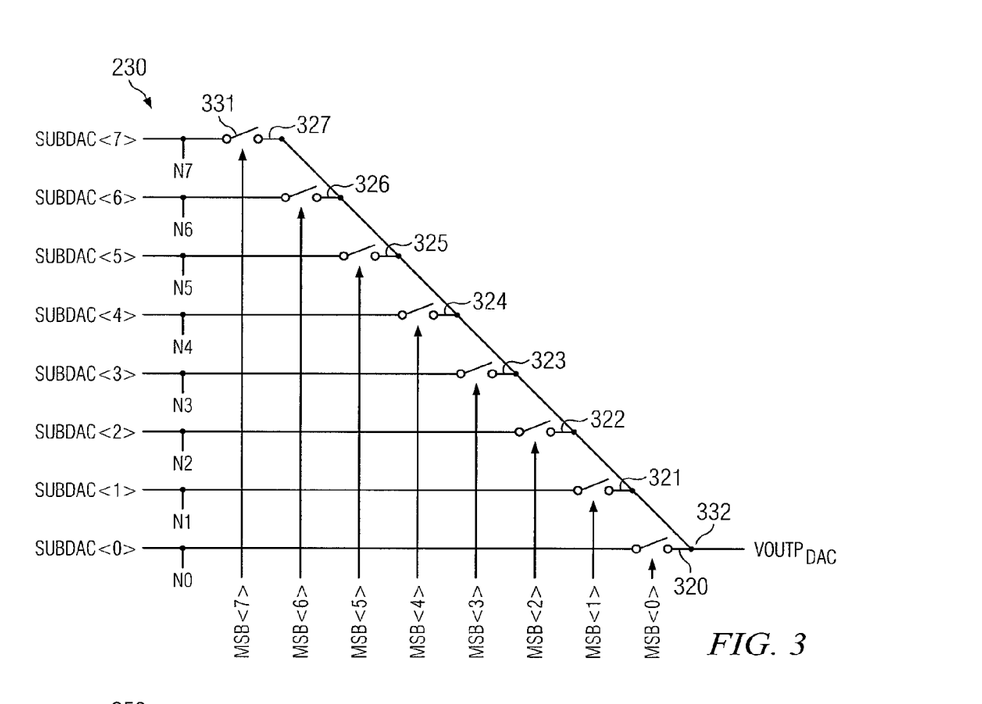
FIG. 3 is a circuit diagram for a multiplexer with a positive differential voltage output.

Reference is now made to FIG. 3, which illustrates the first multiplexer 230. The first multiplexer 230 includes eight multiplexer voltage lines 320-327 and eight input voltage nodes N0-N7, wherein said multiplexer voltage lines 320-327 connect to input voltage nodes N0-N7, respectively. Accordingly, each multiplexer voltage line receives an input voltage, wherein the input voltages connected to multiplexer voltage lines 320-327 are the respective sub-DAC voltages SUB-DAC<7:0>. For example, multiplexer voltage line 320 connects to input voltage node N0, and receives sub-DAC voltage SUBDAC<0>. Additionally, multiplexer voltage lines 321, 322, 323, 324, 325, 326, and 327 receive sub-DAC voltages SUBDAC<1>, SUBDAC<2>, SUBDAC<3>, SUBDAC<4>, SUBDAC<5>, SUBDAC<6>, and SUBDAC<7>, respectively.

The multiplexer 230 further includes eight switches 331 and a voltage output node 332. One switch 331 is connected to each one of the multiplexer voltage lines 320-327, and is operable, when selected, to transmit the sub-DAC voltage received on its respective multiplexer voltage line to the voltage output node 332 of the multiplexer 230, wherein the transmitted voltage is output as the differential output voltage VOUTPDAC of the circuit 200. For example, when the switch 331 located on multiplexer voltage line 324 is closed, the sub-DAC voltage, SUBDAC<4>, received at voltage input node N4 of multiplexer voltage line 324, is transmitted to the voltage output node 332 of the multiplexer 230. Accordingly, for this example, the differential output voltage VOUTPDAC of the circuit 200 is the sub-DAC voltage SUBDAC<4>.

Figure 4:
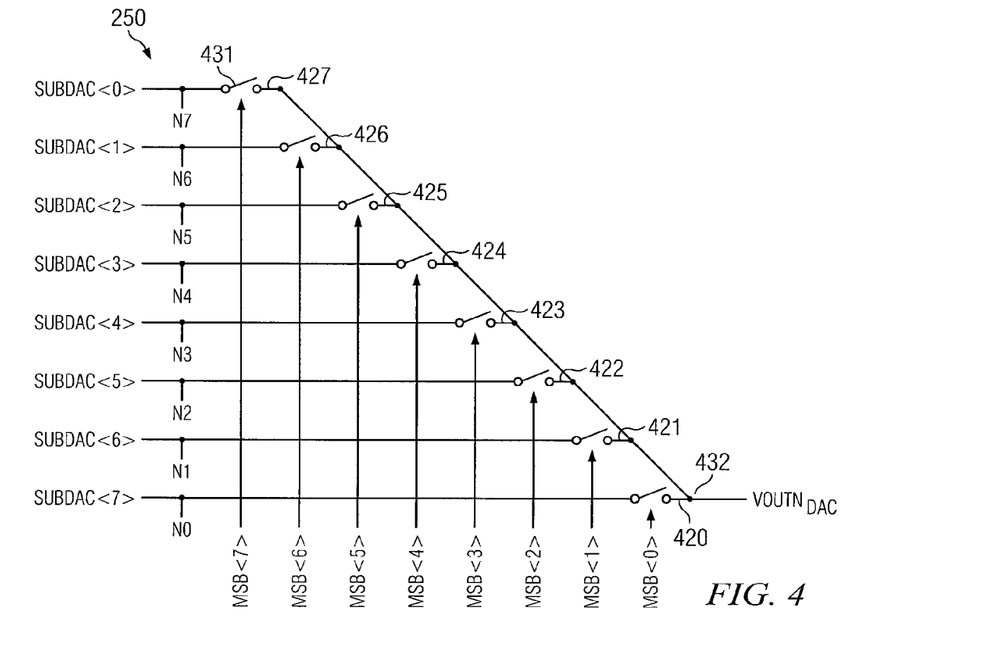
FIG. 4 is a circuit diagram for a multiplexer with a negative differential voltage output.

Reference is now made to FIG. 4, which illustrates the second multiplexer 250. The second multiplexer 250 includes eight multiplexer voltage lines 420-427 and eight input voltage nodes N0-N7, wherein said multiplexer voltage lines 420-427 connect to input voltage nodes N0-N7, respectively. Accordingly, each multiplexer voltage line receives an input voltage, wherein the input voltages connected to multiplexer voltage lines 420-427 are the respective sub-DAC voltages SUBDAC<7:0>. For example, multiplexer voltage line 421 connects to input voltage node N1, and receives sub-DAC voltage SUBDAC<6>. Additionally, multiplexer voltage lines 420, 422, 423, 424, 425, 426, and 427 receive sub-DAC voltages SUBDAC<7>, SUBDAC<5>, SUBDAC<4>, SUBDAC<3>, SUBDAC<2>, SUBDAC<1>, and SUBDAC<0>, respectively.

The multiplexer 250 further includes eight switches 431 and a voltage output node 432. One switch 431 is connected to each one of the multiplexer voltage lines 420-427, and is operable, when selected, to transmit the sub-DAC voltage received on its respective multiplexer voltage line to the voltage output node 432 of the multiplexer 250, wherein the transmitted voltage is also the differential output voltage VOUTNDAC of the circuit 200. For example, when the switch 431 located on multiplexer voltage line 426 is closed, the sub-DAC voltage, SUBDAC<1>, received at voltage input node N6 of multiplexer voltage line 426, is transmitted to the voltage output node 432 of the multiplexer 250. Accordingly, for this example, the differential output voltage VOUTNDAC of the circuit 200 is the sub-DAC voltage SUBDAC<1>.

Referring back to FIG. 2, six-bit binary data is provided to the circuit 200 as input data DATA<5:0>. The four LSBs of the input data, DATA<3:0>, are input to a binary-to-Gray code converter 210, and are converted into three-bit Gray coded data GRAY<2:0>. The Gray coded data, GRAY<2:0>, is then sent to a LSB decoder 212, and decoded to produce a set of unary LSB control signal bits LSB<7:0> (otherwise referred to as a LSB control signal), wherein the set of LSB control signal bits LSB<7:0> is the output of the LSB decoder 212. The columns COL<7:0> of the array of resistors 202 are each connected to respective LSB control signal bits LSB<7:0> of the LSB decoder 212. For example, COL0 is connected to LSB control signal bit LSB<0>, and the switches 205 connected to the resistors 202 located in COL0 are activated by LSB control signal bit LSB<0>. Additionally, the switches 205 connected to the resistors 202 located in columns COL<1:7> are activated by respective LSB control signal bits LSB<1:7>.

The set of unary LSB control signal bits LSB<7:0> is similar to the one described above regarding FIG. 1. Accordingly, only one of the LSB control signal bits LSB<7:0> is active at a time (in response to the Gray coded data GRAY<2:0>), and thus the set of LSB control signal bits LSB<7:0> is operable to select only one of the columns COL<7:0> of resistors 202 and activate the switches 205 connected to the respective resistor taps 203 of the resistors 202 located in the selected column. Accordingly, the set of LSB control signal bits LSB<7:0> determines which one of the eight switches 205 in each row of resistors 202 is closed such that the sub-DAC voltages come from the respective resistor taps 203 connected to the switches 205 in only one column selected by the set of LSB control signal bits LSB<7:0>.

As previously stated, the circuit 200 is similar to the circuit 100 described above regarding FIG. 1. Additionally, the features and implementation of Table 2 are similar to that of Table 1, wherein Table 2 provides a truth table illustrating the input data bits DATA<3:0>, the corresponding 3-bit Gray code GRAY<2:0>, and the decoded unary LSB control signal bits LSB<7:0>. As discussed above with respect to Table 1 and FIG. 1, Gray code is reflective, and may be used to represent more than one input data value. Additionally, the set of LSB control signal bits LSB<7:0> that corresponds to a given Gray code may be used for more than one input data value. Accordingly, the switches 205 connected to all of the resistors 202 located in a column COL<7:0> are activated by LSB control signal bits LSB<7:0> such that when the value of one of the LSB control signal bits LSB<7:0> is a "1," the switches 205 are closed, and sub-DAC voltages SUBDAC<7:0> are received from the respective resistor taps 203 connected to the resistors 202 located in the selected column. As such, switches 205 located along a column of resistors 202 respond to the same LSB control signal regardless of whether the switches 205 are in odd or even rows.

TABLE 2

| Dec Value | DATA<3:0> | GRAY<2:0> | LSB<7:0> | | | | | | | |
|---|---|---|---|---|---|---|---|---|---|---|
| 0 | 0000 | 000 | 0 | 0 | 0 | 0 | 0 | 0 | 0 | 1 |
| 1 | 0001 | 001 | 0 | 0 | 0 | 0 | 0 | 0 | 1 | 0 |
| 2 | 0010 | 011 | 0 | 0 | 0 | 0 | 0 | 1 | 0 | 0 |
| 3 | 0011 | 010 | 0 | 0 | 0 | 0 | 1 | 0 | 0 | 0 |
| 4 | 0100 | 110 | 0 | 0 | 0 | 1 | 0 | 0 | 0 | 0 |
| 5 | 0101 | 111 | 0 | 0 | 1 | 0 | 0 | 0 | 0 | 0 |
| 6 | 0110 | 101 | 0 | 1 | 0 | 0 | 0 | 0 | 0 | 0 |
| 7 | 0111 | 100 | 1 | 0 | 0 | 0 | 0 | 0 | 0 | 0 |
| 8 | 1000 | 100 | 1 | 0 | 0 | 0 | 0 | 0 | 0 | 0 |
| 9 | 1001 | 101 | 0 | 1 | 0 | 0 | 0 | 0 | 0 | 0 |
| 10 | 1010 | 111 | 0 | 0 | 1 | 0 | 0 | 0 | 0 | 0 |
| 11 | 1011 | 110 | 0 | 0 | 0 | 1 | 0 | 0 | 0 | 0 |
| 12 | 1100 | 010 | 0 | 0 | 0 | 0 | 1 | 0 | 0 | 0 |
| 13 | 1101 | 011 | 0 | 0 | 0 | 0 | 0 | 1 | 0 | 0 |
| 14 | 1110 | 001 | 0 | 0 | 0 | 0 | 0 | 0 | 1 | 0 |
| 15 | 1111 | 000 | 0 | 0 | 0 | 0 | 0 | 0 | 0 | 1 |
| . | . | . | . | . | . | . | . | . | . | . |
| . | . | . | . | . | . | . | . | . | . | . |
| . | . | . | . | . | . | . | . | . | . | . |
| 63 | 1111 | 000 | 0 | 0 | 0 | 0 | 0 | 0 | 0 | 1 |

The reflective nature of Gray code allows the circuit to control the switches 205 in a specific column with only one set of LSB control signal bits LSB<7:0>. Therefore, by implementing a decoding method using Gray code, the circuit is able to control the switches 205 for the resistors 202 in both odd and even rows of the same column with only one control signal, even if the binary input data is different for the resistors 202 located in the odd and even rows. Hence, it is unnecessary to provide circuitry for an additional control signal to control switches 205 in odd or even rows. By reducing unnecessary circuitry, less space and power are consumed by the differential DAC circuit 200.

The three MSBs of the input data, DATA<5:3>, are input to a MSB decoder 214, and decoded to produce a set of unary MSB control signal bits MSB<7:0> (otherwise referred to as a MSB control signal). The set of MSB control signal bits MSB<7:0> is the output of the MSB decoder 214, and each of the MSB control signal bits MSB<7:0> is connected to the first multiplexer 230 and the second multiplexer 250.

Referring back to the first multiplexer 230 illustrated in FIG. 3, each MSB control signal bit MSB<7:0> is connected to one of the switches 331 affixed to respective multiplexer voltage lines 320-327. Specifically, the control signal bits MSB<0>, MSB<1>, MSB<2>, MSB<3>, MSB<4>, MSB<5>, MSB<6>, and MSB<7> are connected to the switches 331 located at multiplexer voltage lines 320, 321, 322, 323, 324, 325, 326, and 327, respectively. The switches 331 are activated by MSB control signal bits MSB<7:0> such that when the value of the MSB control signal bit connected to a switch 331 is a "1," the switch 331 is closed, and the voltage located at the switch 331 is transmitted to the voltage output node 332 of the multiplexer 230. The set of MSB control signal bits MSB<7:0> determines which of the received sub-DAC voltages is selected as the differential output voltage, VOUTPDAC, of the multiplexer 230. For example, if MSB control signal bit MSB<7> is a "1," the switch 331 connected to multiplexer voltage line 327 closes, and SUBDAC<7> is transmitted to the voltage output node 332 of the multiplexer 230 and is the differential output voltage, VOUTPDAC, of the first multiplexer 230.

Referring back to the second multiplexer 250 illustrated in FIG. 4, each MSB control signal bit MSB<7:0> is connected to one of the switches 431 affixed to respective multiplexer voltage lines 420-427. Specifically, the control signal bits MSB<0>, MSB<1>, MSB<2>, MSB<3>, MSB<4>, MSB<5>, MSB<6>, and MSB<7> are connected to the switches 431 located at multiplexer voltage lines 420, 421, 422, 423, 424, 425, 426, and 427 respectively. The switches 431 are activated by MSB control signal bits MSB<7:0> such that when the value of the MSB control signal bit connected to a switch 431 is a "1," the switch 431 is closed, and the voltage located at the switch 431 is transmitted to the voltage output node 432 of the multiplexer 250. The set of MSB control signal bits MSB<7:0> determines which of the received sub-DAC voltages is selected as the differential output voltage, VOUTNDAC, of the multiplexer 250. For example, if MSB control signal bit MSB<7> is a "1," the switch 431 connected to multiplexer voltage line 427 closes, and SUBDAC<0> is transmitted to the voltage output node 432 of the multiplexer 250 and is the differential output voltage, VOUTNDAC, of the second multiplexer 250.

The set of MSB control signal bits MSB<7:0> received by the first multiplexer 230 connect to the switches 331 affixed to multiplexer input voltage lines 320-327, respectively, and the set of MSB control signal bits MSB<7:0> received by the second multiplexer 250 connect to the switches 431 affixed to multiplexer input voltage lines 420-427, respectively. As illustrated in FIGS. 2-4, the input voltages SUBDAC<7:0> of the first multiplexer 230 are connected in reverse order of the input voltages connected to the second multiplexer 250. Accordingly, Table 3 illustrates that for a given set of MSB control signal bits MSB<7:0>, the differential output voltage, VOUTPDAC, for the first multiplexer 230 is a positive differential voltage, while the differential output voltage, VOUTNDAC, for the second multiplexer 250 is a negative differential voltage. In accordance with the present disclosure, any reference to a "positive" and "negative" differential voltage refers to the greater and lesser voltage values, respectively, of a differential mode voltage output that is reflected about a common mode voltage, and is not necessarily an indication that said voltage values are a positive or negative number.

TABLE 3

| DATA<5:3> | MSB<7:0> | | | | | | | | VOUTP | VOUTN |
|---|---|---|---|---|---|---|---|---|---|---|
| 000 | 0 | 0 | 0 | 0 | 0 | 0 | 0 | 1 | SUBDAC<0> | SUBDAC<7> |
| 001 | 0 | 0 | 0 | 0 | 0 | 0 | 1 | 0 | SUBDAC<1> | SUBDAC<6> |
| 010 | 0 | 0 | 0 | 0 | 0 | 1 | 0 | 0 | SUBDAC<2> | SUBDAC<5> |
| 011 | 0 | 0 | 0 | 0 | 1 | 0 | 0 | 0 | SUBDAC<3> | SUBDAC<4> |
| 100 | 0 | 0 | 0 | 1 | 0 | 0 | 0 | 0 | SUBDAC<4> | SUBDAC<3> |
| 101 | 0 | 0 | 1 | 0 | 0 | 0 | 0 | 0 | SUBDAC<5> | SUBDAC<2> |
| 110 | 0 | 1 | 0 | 0 | 0 | 0 | 0 | 0 | SUBDAC<6> | SUBDAC<1> |
| 111 | 1 | 0 | 0 | 0 | 0 | 0 | 0 | 0 | SUBDAC<7> | SUBDAC<0> |

As described above with respect to FIGS. 2-4 and Table 3, for an input data signal, DATA<5:0>, the MSB decoder 214 receives the three MSBs of the input signal (bits DATA<5:3>) and generates an eight-bit MSB control signal comprising bits MSB<7:0>, wherein the set of MSB control signal bits MSB<7:0> is sent to the first multiplexer 230 and second multiplexer 250. For an exemplary MSB control signal in which bit MSB<1> is set to a "1," the switch 331 connected to multiplexer voltage line 321 of FIG. 3 is closed, and SUB-DAC<1> is transmitted to the voltage output node 332 and is the differential output voltage, VOUTPDAC, of the first multiplexer 230. Additionally, the switch 431 connected to multiplexer voltage line 421 of FIG. 4 is closed, and SUB-DAC<6> is transmitted to the voltage output node 432 and is the differential output voltage, VOUTNDAC, of the second multiplexer 250. Accordingly, when MSB<1> is set, sub-DAC voltages SUBDAC<1> and SUBDAC<6> are the positive and negative differential voltages, respectively. Conversely, when MSB<6> is set, sub-DAC voltages SUBDAC<6> and SUBDAC<1> are the positive and negative differential voltages, respectively. Table 3 provides a list of the positive and negative differential voltages that correspond with a given MSB control signal.

As stated above, the string of series-connected resistors 202 is shared by the first and second multiplexers 230 and 250, and the respective differential output voltages, VOUTPDAC and VOUTNDAC, of the first and second multiplexers 230 and 250, are reflected about the common mode voltage of the differential DAC circuit 200. Therefore, for two opposite input data bits DATA<5:0>, for example, 110011 and 001100, the differential output voltages are complementary. In other words, for two opposite input data bits, the absolute value of each of the differential output voltages will be equal in magnitude. When the resistor string has a mismatch, the DAC still shows an inversed symmetric transfer curve, which results in very low even-order harmonics.

The sharing of resistor string 202 between multiplexers 230 and 250, combined with the implementation of Gray code to generate the set of LSB control signal bits LSB<7:0>, significantly reduces the number of components that would otherwise be required of a conventional differential resistor string DAC circuit. As such, the surface area and power consumption required of the circuit is greatly reduced while negligible offset error, non-linearity, and harmonics are maintained.

What is claimed is:

1. A resistor string digital-to-analog converter apparatus comprising:
   a string of resistors disposed in an array of columns and rows between a first reference voltage node and a second reference voltage node, each resistor in the string having a resistor tap;
   a switch connected to each resistor tap, the switches in each row operable to connect the resistor taps in that row to one of a plurality of voltage lines;
   a converter operable to receive a first portion of input data and convert said first portion of input data to Gray code data;
   a first decoder operable to receive said Gray code data and generate a first control signal, said first control signal operable to activate the switches in a single column;
   a second decoder operable to receive a second portion of said input data and generate a second control signal; and
   a first multiplexer coupled to the plurality of voltage lines, and operable, in response to the second control signal, to select one of the plurality of voltage lines and output a first output voltage from the selected voltage line.

2. The digital-to-analog converter apparatus as set forth in claim 1, wherein said first and second decoders are binary-to-unary decoders.

3. The digital-to-analog converter apparatus as set forth in claim 1, wherein said first portion and second portions of said input data bits overlap by at least one bit.

4. A differential resistor string digital-to-analog converter apparatus comprising:
   a string of resistors disposed in an array of columns and rows between a first reference voltage node and a second reference voltage node, each resistor in the string having a resistor tap;
   a switch connected to each resistor tap, the switches in each row operable to connect the resistor taps in that row to one of a plurality of voltage lines;
   a converter operable to receive a first portion of input data and convert said first portion of input data to Gray code data;
   a first decoder operable to receive said Gray code data and generate a first control signal, said first control signal operable to activate the switches in a single column;
   a second decoder operable to receive a second portion of said input data and generate a second control signal;
   a first multiplexer coupled to the plurality of voltage lines, and operable in response to the second control signal to select one of the plurality of voltage lines and output a first output voltage from the selected voltage line; and
   a second multiplexer coupled to the plurality of voltage lines, and operable in response to the second control signal to select one of the plurality of voltage lines and output a second output voltage from the selected voltage line.

5. The digital-to-analog converter apparatus as set forth in claim 4, wherein said first output voltage is a positive differential output voltage.

6. The digital-to-analog converter apparatus as set forth in claim 5, wherein said second output voltage is a negative differential output voltage.

7. The digital-to-analog converter apparatus as set forth in claim 6, wherein said positive and negative differential output voltages are reflected about a common mode voltage.

8. The digital-to-analog converter apparatus as set forth in claim 7, wherein said positive and negative differential output voltages are complementary.

9. The digital-to-analog converter apparatus as set forth in claim 4, wherein said first and second decoders are binary-to-unary decoders.

10. The digital-to-analog converter apparatus as set forth in claim 4, wherein the plurality of voltage lines are connected to the first multiplexer in a first sequential order, and the plurality of voltage lines are connected to the second multiplexer in a second sequential order, wherein the second sequential order is the reverse of the first sequential order.

11. The digital-to-analog converter apparatus as set forth in claim 4, wherein said first portion and second portions of said input data bits overlap by at least one bit.

12. A method for controlling a plurality of tap switches connected to taps in a resistor string arranged in a column and row format, said method comprising:
   applying a reference voltage across said resistor string;
   receiving input data bits;
   converting a first portion of said input data bits to Gray code bits;
   decoding said Gray code bits to generate a first control signal, said first control signal operable to activate the tap switches in one column of said resistor string;

receiving a resistor string voltage from each activated tap switch at a first multiplexer;

decoding a second portion of said input data bits to generate a second control signal, said second control signal operable to activate a single multiplexer switch in said first multiplexer; and outputting a first voltage from the activated multiplexer switch.

13. The method as set forth in claim 12, wherein said first and second portions of said input data bits overlap by at least one bit.

14. The method as set forth in claim 12, wherein said resistor string is a differential resistor string having a common mode voltage.

15. The method as set forth in claim 14, said method further including:

receiving said resistor string voltage from each activated tap switch at a second multiplexer;

wherein said second control signal is further operable to activate a different single multiplexer switch in said second multiplexer; and outputting a second voltage from said activated different single multiplexer switch.

16. The method as set forth in claim 15, wherein said first and second voltages are differential output voltages reflected about the common mode voltage of the differential resistor string.

17. A method for controlling a plurality of taps in a resistor string arranged in a column and row format, said method comprising:

applying a reference voltage across said resistor string;
receiving input data bits;
converting a first portion of said input data bits to Gray code bits;

decoding said Gray code bits to generate a first control signal, said first control signal operable to select one column of taps;

receiving one resistor string voltage from each tap in the selected column at a first multiplexer;

decoding a second portion of said input data bits to generate a second control signal, said second control signal operable to select one of the resistor string voltages received at said first multiplexer; and outputting the selected resistor string voltage as a first output voltage.

18. The method as set forth in claim 17, wherein said first and second portions of said input data bits overlap by at least one bit.

19. The method as set forth in claim 17, wherein said resistor string is a differential resistor string having a common mode voltage.

20. The method as set forth in claim 19, said method further including:

receiving said resistor string voltage from each tap at a second multiplexer;

wherein said second control signal is further operable to select a resistor string voltage received at said second multiplexer; and outputting the resistor string voltage selected at the second multiplexer as a second output voltage.

21. The method as set forth in claim 20, wherein said first and second output voltages are differential output voltages reflected about the common mode voltage of the differential resistor string.

* * * * *

UNITED STATES PATENT AND TRADEMARK OFFICE
CERTIFICATE OF CORRECTION

| | | |
|---|---|---|
| PATENT NO. | : 8,237,596 B2 | Page 1 of 1 |
| APPLICATION NO. | : 12/964228 | |
| DATED | : August 7, 2012 | |
| INVENTOR(S) | : Jianhua Zhao et al. | |

It is certified that error appears in the above-identified patent and that said Letters Patent is hereby corrected as shown below:

In the Specification:

At column 6, line number 30, please replace [COLT] with -- COL7 --.

Signed and Sealed this
Eighteenth Day of September, 2012

David J. Kappos
*Director of the United States Patent and Trademark Office*